(12) United States Patent
Baker et al.

(10) Patent No.: US 9,299,423 B2
(45) Date of Patent: *Mar. 29, 2016

(54) OPTICAL INTERCONNECT IN HIGH-SPEED MEMORY SYSTEMS

(71) Applicant: MICRON TECHNOLOGY, INC., Boise, ID (US)

(72) Inventors: Jacob Baker, Boise, ID (US); Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/263,321

(22) Filed: Apr. 28, 2014

(65) Prior Publication Data

US 2014/0281199 A1    Sep. 18, 2014

Related U.S. Application Data

(63) Continuation of application No. 13/080,376, filed on Apr. 5, 2011, now Pat. No. 8,712,249, which is a continuation of application No. 09/941,557, filed on Aug. 30, 2001, now Pat. No. 7,941,056.

(51) Int. Cl.
*H04B 10/00* (2013.01)
*G11C 11/42* (2006.01)
*G06F 13/16* (2006.01)

(52) U.S. Cl.
CPC ............... *G11C 11/42* (2013.01); *G06F 13/16* (2013.01); *Y02B 60/1228* (2013.01)

(58) Field of Classification Search
CPC ... H04B 10/152; H04B 10/801; H04B 10/802

USPC .......................... 398/151, 162–167, 195–196
See application file for complete search history.

(56) References Cited

U.S. PATENT DOCUMENTS

| | | |
|---|---|---|
| 4,707,823 A | 11/1987 | Holdren et al. |
| 5,146,607 A * | 9/1992 | Sood et al. .................... 711/211 |
| 5,243,703 A | 9/1993 | Farmwald et al. |
| 5,319,755 A | 6/1994 | Farmwald et al. |
| 5,355,391 A | 10/1994 | Horowitz et al. |
| 5,367,397 A | 11/1994 | Tajima |
| 5,432,823 A | 7/1995 | Gasbarro et al. |
| 5,544,319 A | 8/1996 | Acton et al. |
| 5,581,767 A | 12/1996 | Katsuki et al. |
| 5,606,717 A | 2/1997 | Farmwald et al. |
| 5,638,334 A | 6/1997 | Farmwald et al. |
| 5,903,370 A | 5/1999 | Johnson |
| 5,928,343 A | 7/1999 | Farmwald et al. |
| 5,949,562 A | 9/1999 | Kubota et al. |
| 6,185,352 B1 | 2/2001 | Hurley |
| 6,222,861 B1 * | 4/2001 | Kuo et al. ........................ 372/20 |
| 6,498,775 B1 | 12/2002 | Fan et al. |

(Continued)

FOREIGN PATENT DOCUMENTS

EP         849685      6/1998
WO    WO 93/19422    9/1993

*Primary Examiner* — Dzung Tran
(74) *Attorney, Agent, or Firm* — Perkins Coie LLP

(57) ABSTRACT

A optical link for achieving electrical isolation between a controller and a memory device is disclosed. The optical link increases the noise immunity of electrical interconnections, and allows the memory device to be placed a greater distance from the processor than is conventional without power-consuming I/O buffers.

19 Claims, 7 Drawing Sheets

(56) References Cited

U.S. PATENT DOCUMENTS

| | | |
|---|---|---|
| 6,529,534 B1 | 3/2003 | Yasuda |
| 6,567,963 B1 | 5/2003 | Trezza |
| 6,603,896 B1 * | 8/2003 | MacCormack et al. ........ 385/24 |
| 6,651,139 B1 * | 11/2003 | Ozeki et al. ................... 711/118 |
| 6,658,210 B1 * | 12/2003 | Fee ................................. 398/79 |
| 6,782,017 B1 | 8/2004 | Kai et al. |
| 6,782,209 B2 | 8/2004 | Copeland et al. |
| 7,133,610 B1 | 11/2006 | Shimura et al. |
| 2001/0015837 A1 | 8/2001 | Hung |

* cited by examiner

OPTICAL INTERCONNECT IN HIGH-SPEED MEMORY SYSTEMS

CROSS-REFERENCE TO RELATED APPLICATIONS

This application is a continuation of U.S. patent application Ser. No. 13/080,376, filed on Apr. 5, 2011, issuing on Apr. 29, 2014, as U.S. Pat. No. 8,712,249, which is a continuation of U.S. patent application Ser. No. 09/941,557, filed on Aug. 30, 2001, now U.S. Pat. No. 7,941,056, issued May 10, 2011, the subject matter of each of which is incorporated in their entirety by reference herein.

FIELD OF THE INVENTION

The present invention relates to communicating at high speed data signals to and from memory storage devices such as DRAM memory devices.

BACKGROUND OF THE INVENTION

As computer processor and DRAM (Dynamic Random Access Memory) memory speeds increase, their bus speeds increase also. This increased speed also increases signal noise at connection points where a memory controller and DRAM memory devices connect to a bus. In addition, the connections of the bus also have associated electrical properties such as capacitance and inductance which, while causing minimal problems at low data speeds, causes increasingly significant problems at high speed. Consequently, at high speed, conventional bus arrangements can introduce signal distortion, noise, delays and other unwanted spurious signal phenomenon.

Current memory devices commonly operate at hundreds of megahertz, but it is anticipated that computer bus speeds, which tend to run slightly slower than microprocessor speeds, will soon extend beyond 1 GHz. At such high frequencies, the minutest amount of signal aberration caused by the electrical properties of the electrical bus may cause severe and unexpected consequences. Additionally, the distance between components on a bus must be kept short, to minimize signal distortions and help insure that data and control signals reach their destination very quickly.

Accordingly, a memory bus structure which reduces or eliminates signal distortion, noise, and other problems and permits reliable high speed (e.g. greater than 1 GHz) operation is desired.

BRIEF SUMMARY OF THE INVENTION

In one aspect the invention provides a memory apparatus and method of its operation which utilizes an optical path connected between a memory controller or processor and at least one memory device for passing data between the controller or processor and memory device at high throughput speed.

BRIEF DESCRIPTION OF THE DRAWINGS

The foregoing and other features and advantages of the invention will become more apparent from the detailed description of the exemplary embodiments of the invention given below with reference to the accompanying drawings in which.

DETAILED DESCRIPTION OF THE PREFERRED EMBODIMENTS

Figure 1:
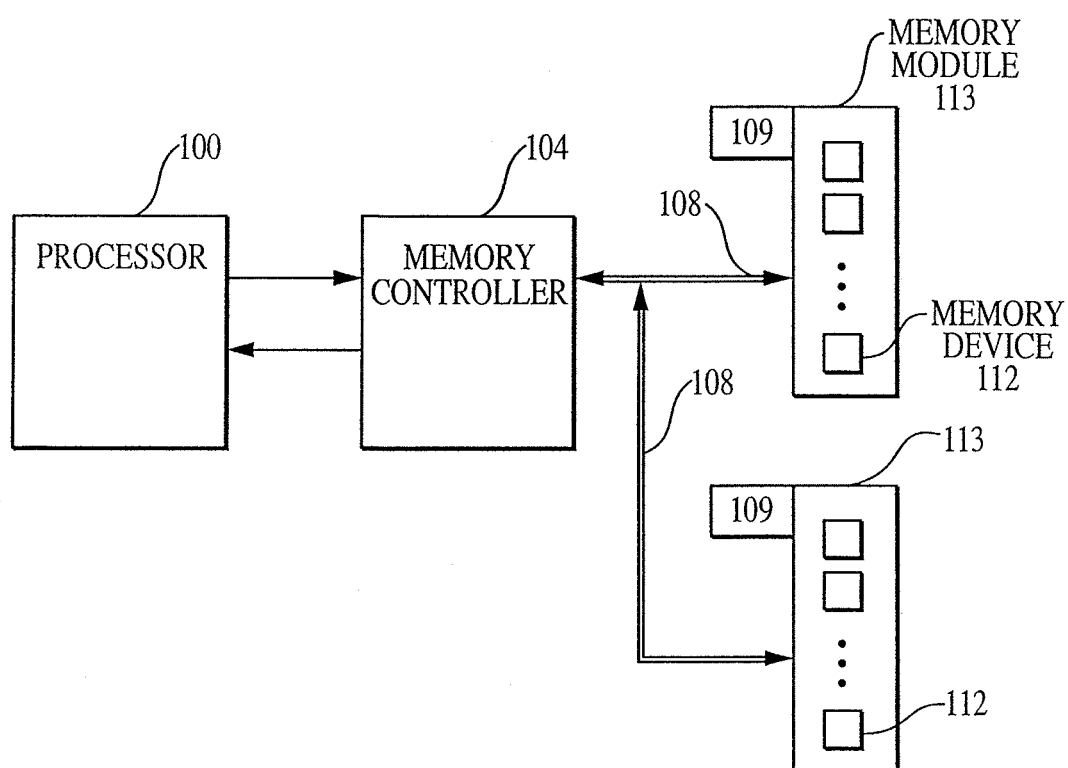
FIG. 1 shows a generic overview of the present invention.

The present invention uses one or more optical links between a processor and/or a memory controller and a DRAM memory device. The optical link includes, but is not limited, to optical fiber and optical waveguide links as described below in connection with various exemplary embodiments of the invention. FIG. 1 shows a high level block diagram of the present invention. A processor 100 is connected to a memory controller 104 which in turn is connected to a memory module 113 containing one or more memory devices 112 using one or more optical links 108. The memory controller 104 and modules 113 have optical couplers which enable them to connect to the optical links 108 to maintain optical continuity. The modules 113 have optical plug-in connectors to the optical links 108, but also have standard (non-optical) Dual Inline Memory Module (DIMM) connectors 109 for supplying power and other low-frequency signals.

In the context of the invention, the processor 100, controller 104, and memory devices 112 can be located either on the same die or located on separate dies. In some cases, processor 100 can also serve as the memory controller 104 in which case a separate memory controller 104 can be omitted.

Figure 2:
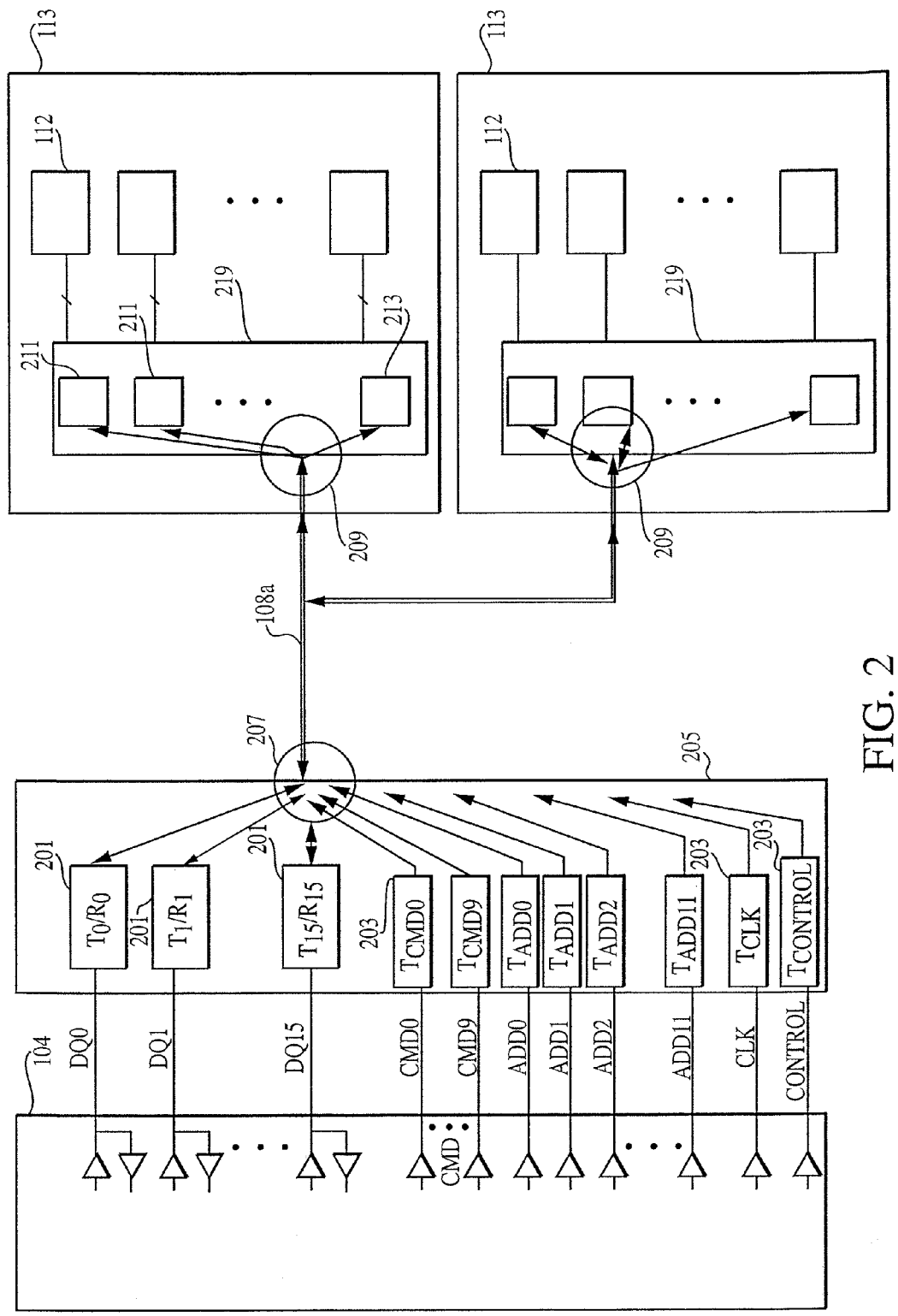
FIG. 2 shows one exemplary embodiment of the invention.

FIG. 2 shows a first exemplary embodiment of the invention in which a single common optical link 108a transmits a plurality of data streams between a memory controller 104 and memory modules 113 using paired optical transmitters and receivers on opposite sides of link 108a pre-set to communicate at a respective wavelength. FIG. 2 shows the use of separate data (DQ), command (CMD), address (ADD), and clock (CLK) paths between controller 104 and each memory module 113 as is typical in a computer bus structure. It is also possible to send control and address data over the same data paths as is also well known in the art. For brevity, only the data (DQ) optical path will be discussed in detail, it being understood that the optical paths for other data and clock information sent by the controller will be handled the same except for the direction of data/clock pulse flow. It should also be understood that while the data (DQ) paths are bidirectional, the command/address and clock paths are unidirectional in that the dataflow is from controller 104 to the modules 113 and associated memory devices 112.

As shown in FIG. 2, each data DQ path of the memory controller 104 is coupled to a respective optical transmitting/receiving device $T_0/R_0 \ldots T_{15}/R_{15}$, each collectively identified by the label 201. Each transmitting/receiving device converts an electrical signal received from a DQ path of memory controller 114 and converts the electrical signal to an optical signal for transmission on optical link 108a to a memory module 113 over optical link 108a. Each transmitter/receiver 201 is also capable of receiving an optical signal from a module 113 and converting it to an electrical signal and sending it to controller 104 on a respective data (DQ) path.

In addition to the transmitter/receivers 201 provided on the controller side, respective transmitters 203 are also provided for converting each of the electrical signals on the command, address and clock signal paths to optical signals over link 108a and transmitting these optical signals to modules 113. The transmitter/receivers 201 and transmitters 203 may form part of an electrical/optical converter 205.

The FIG. 2 embodiment uses a single optical link 108a constructed as an optical fiber or optical waveguide between controller 104 and the memory modules 113. In this way, many datapins of controller 104 communicate over a single optical link 108a. In order to keep the optical signals from the different data (DQ), command (CMD), address (ADDRESS), and clock (CLK) paths from interfering with each other, wave division multiplexing is employed so that the optical signals from each of the transmitter/receiver devices 201 and transmitter devices 203 have a respective optical carrier wavelength (frequency) which is modulated by data sent on the various signal paths from controller 104 to converter 205. Likewise, the optical receiver portion of each transmitter/receiver 201 operates at a respective optical wavelength.

As further shown in FIG. 2, the various optical signals from transmitter/receivers 201 and transmitters 203 are optically combined in a multiplexing portion of a wavelength division multiplexer/demultiplexer 207 for transmission over the common optical link 108a to memory modules 113.

Each module 113 also contains a wave division multiplexer/demultiplexer 209 which receives the optically multiplexed signals on optical link 108a and wavelength demultiplexes them in a demutiplexer portion and passes the demuplexed signals to respective transmitter/receivers 211, which electrically connect to the data (DQ) paths of the memory devices 112. In addition, the demultiplexed optical signals for the command (CMD), address (ADD) (or combined command/address) and clock (CLK) signal paths are passed on to receivers 213 which convert optical signals to electrical signals which are electrically coupled to the electrical command (CMD), address (ADD) and clock (CLK) signal paths of the memory devices 112.

Data read from memory devices 112 is transmitted on the data (DQ) paths of the memory devices 112 to respective transmitter/receivers 211 where the electrical data is converted to an optical signal at a respective wavelength and sent to multiplexer/demultiplexer 209 where the data on the respective DQ optical paths is combined in the wave division multiplexer of multiplexer/demultiplexer 209. This data is then sent over optical link 108a to multiplexer/demultiplexer 207 where it is demultiplexed and passed to respective transmitter/receivers 201 where the DQ optical data is connected to electrical DQ data which is sent to respective DQ data paths of controller 104. FIG. 2 illustrates the optical coupling of two memory modules 113 to memory controller 104 through the electro-optical converter 205 provided at the memory controller 104 side of optical link 108 and an electro-optical converter and 219 provided on the memory modules 113; however, it should be understood that any number of memory modules 113, containing any number of memory devices 112, may be optically coupled to controller 104 over optical link 108a.

Figure 3:
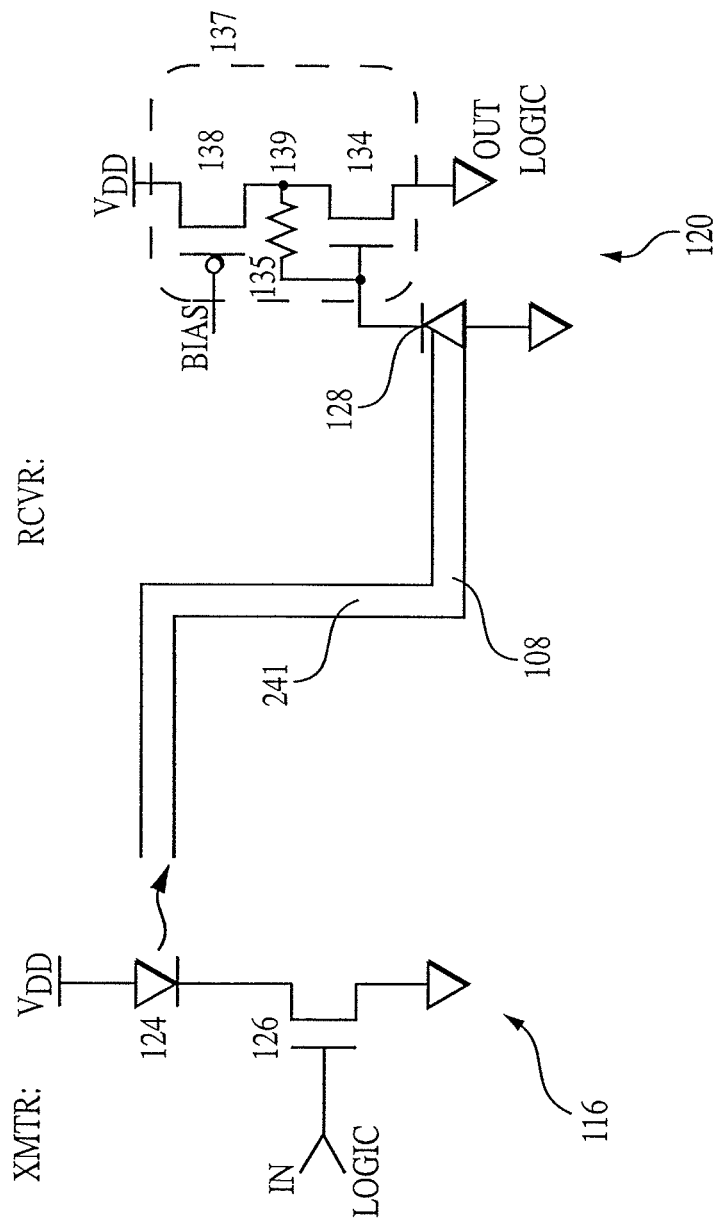
FIG. 3 shows a transistor-level view of the transmitter and receiver used in an exemplary embodiment of the invention.

FIG. 3 shows a simplified optical transmitter 116 and optical receiver 120 which may be used in the electro/optical transmitter/receivers 201, 211 and in the electro/optical transmitters 203 and receivers 213. A LED (Light Emitting Diode) or ILD (Injection Laser Diode) light emitter 124 in transmitter 116 provides a light output signal to an optical path 241 at a predefined wavelength, in response to an applied electrical signal at the gate of a transistor 126. At the receiver 120 side, a photodiode 128 couples light pulses received from an optical path 241 to the gate of an n-channel transistor 134. A p-channel biasing transistor 138 sources current to the n-channel transistor 134. A resistor 135 is positioned between the gate of transistor 134, as well as the drain of transistor 138. The transistors 134 and 138 and resistor 135 form an inverting amplifier 137. The output 139 of the inverting amplifier 137 is an electrical signal.

Although FIG. 3 illustrates the light transmitter 116 and receiver 120 as discrete components, these devices are actually integrated devices which may be integrated together with multiplexer/demultiplexer 207 on a converter 205 chip or integrated on the same chip as the memory controller 104. At the module 113, the transmitter 116 and receiver 120 are preferably integrated on the same chip which contains the multiplexer/demultiplexer 209. It is also possible to integrate the transmitter 116 and receiver 120 on the module side within the actual memory devices 112 in which case each memory device 112 would contain its own converter circuit 219 shown in FIG. 3.

Although a silicon substrate may be used for integrating the LED or ILD light emitter 124 and/or photodiode 128, the more preferred substrate material for such devices, particularly for LED or ILD 124 is gallium arsenide, as known in the art. Finally, it should be understood that while FIG. 3 illustrates a unidirectional data path, in actuality the data (DQ) paths in a memory system are bi-directional and that an optical transmitter 116 and receiver 120 are therefore understood to be employed at each path end of a bidirectional optical link 108a, as shown by transmitter/receivers 201 and 211.

As noted, the FIG. 2 arrangement relies on wavelength division multiplexing of the different signal paths which exist between memory controllers 104 and the individual memory devices 112. Thus, each transmitter/receiver 201, transmitter 203 and receiver 235 as well as multiplexer/demultiplexers 207, 209 must operate at specified optical wavelengths. These wavelengths can be controlled using known filter circuits. However, it is often difficult to ensure that a manufacturer's device operates precisely at a predetermined wavelength. To this end, it is also known to adjust operating conditions of an electro/optical device to ensure that it operates at a predetermined wavelength.

Figure 4:
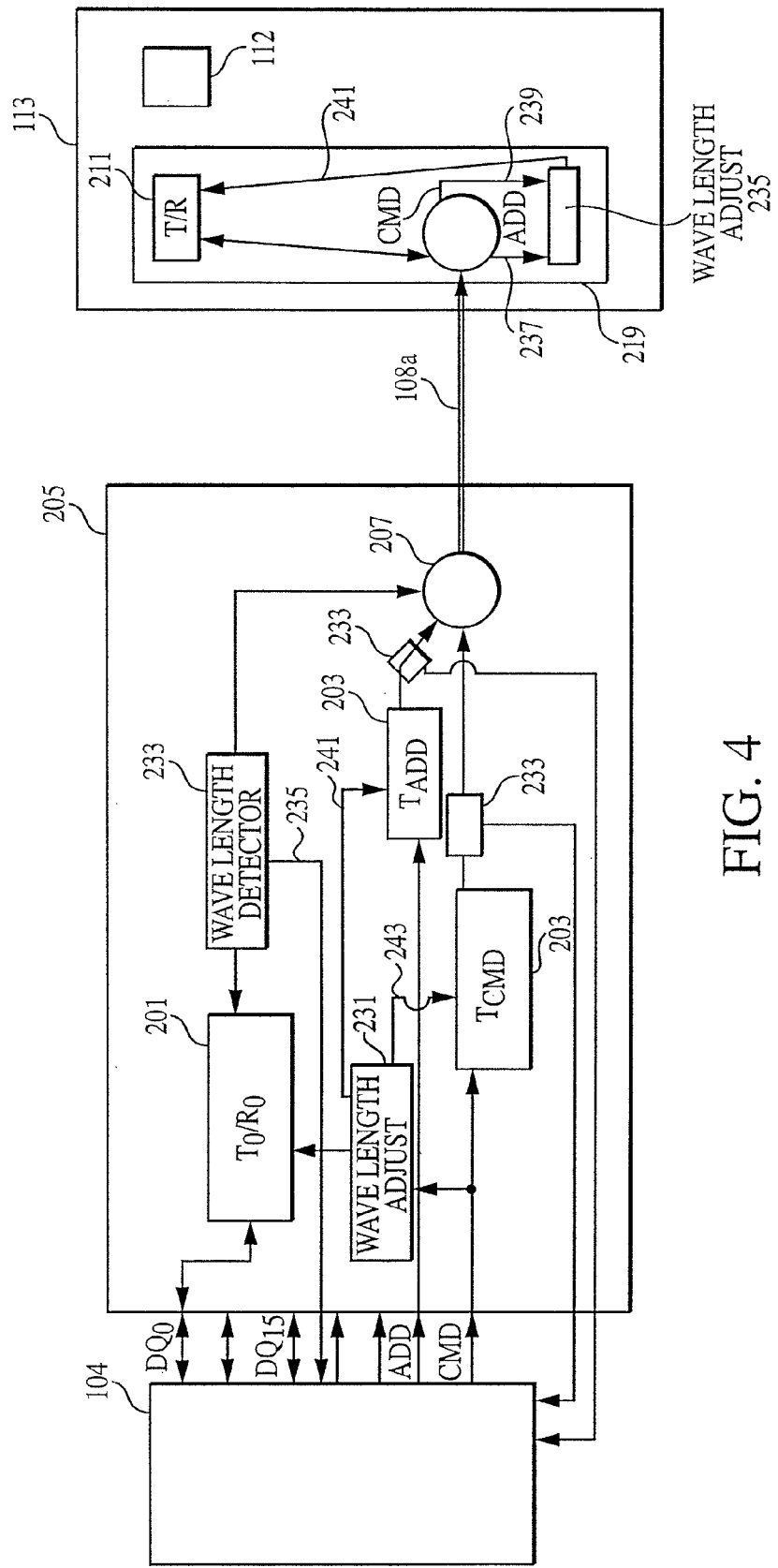
FIG. 4 shows a second exemplary embodiment of the invention.

FIG. 4 shows a modification of a portion of the system of FIG. 2, where transmitting devices 201 and receiving devices 203 are shown as being wavelength-adjustable. For clarity, only the DQ0 pin is shown, while DQ1-DQ15 are implied, similar to the representation in FIG. 2. During fabrication, the thicknesses and purities of the materials deposited as well as other factors make it difficult to fabricate a transmitter 203 and the transmitter portion of receiver/transmitters 201 and 211 to transmit at a precise predefined wavelength. Accordingly, the light emitters are wavelength adjustable. Wavelength detectors 233 are used to sense the nominal wavelength of an optically transmitted signal from each of the transmitters of devices 201 and 203 and data representing the sensed wavelength is fed back to controller 104 which determines if a transmitter is transmitting at its assigned wavelength and, if not, a wavelength adjuster 231 is operated by controller 104 which sends data to an addressed wavelength adjuster 231 for adjusting the wavelength over the command (CMD) signal path. Separate control signal paths can also be used for this purpose. The wavelength of optical signals sent by the data transmitters 211 in the modules 113 can also be sensed by the wavelength detector 233 and adjustment data can be sent to addressed wavelength adjuster 235 on the module 113 which adjusts the wavelength of the transmitter portion of transmitter/receiver 211. The adjustments can be accomplished during initialization of the memory system for operation.

Figure 5:
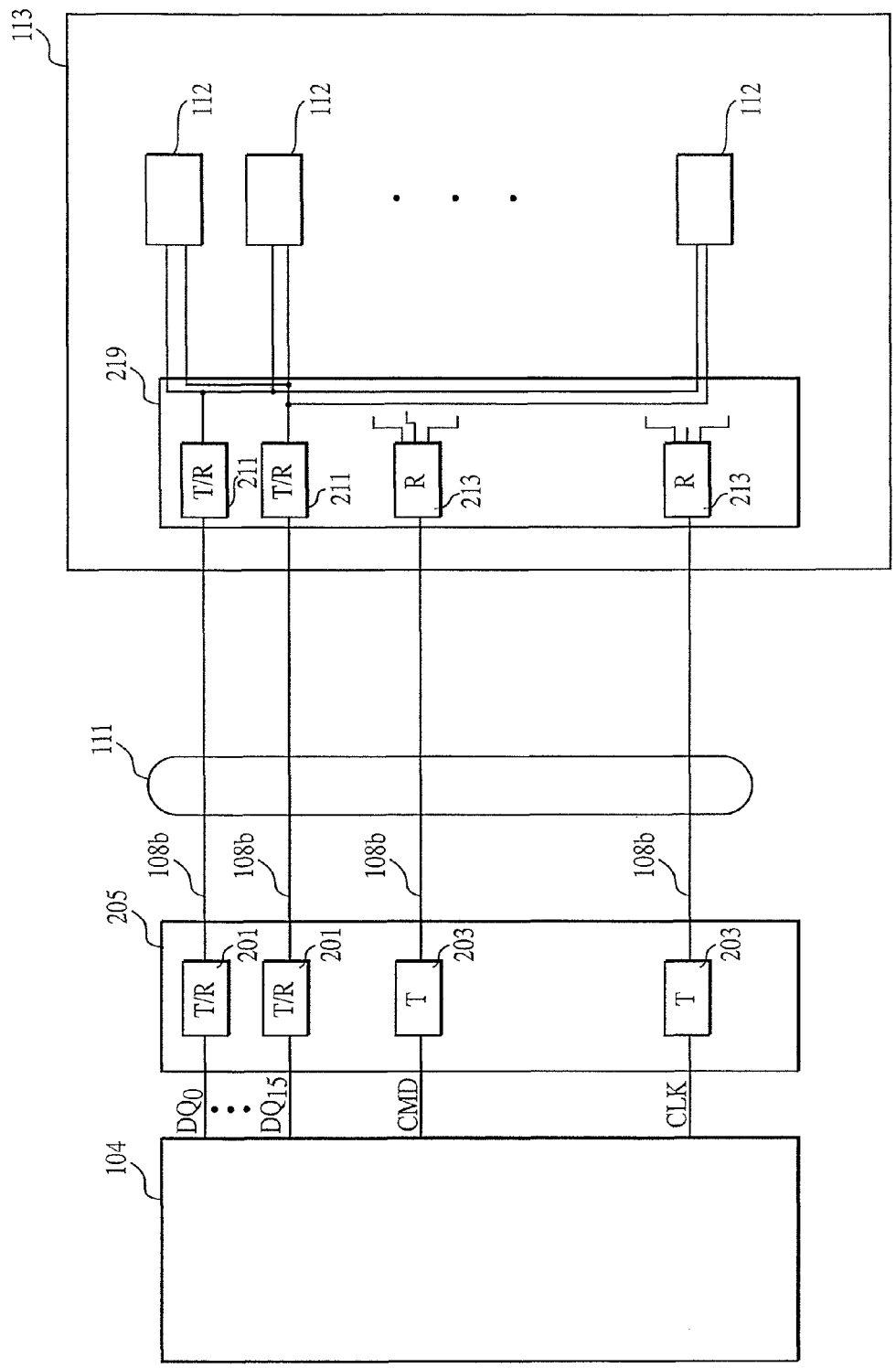
FIG. 5 shows a third exemplary embodiment of the invention.

FIG. 5 shows another embodiment of the invention, which utilizes an optical link 108b for each data path on an optical bus 111. In this embodiment there is a one-to-one replacement of an electrical bus line which normally interconnects memory controller 104 with a memory module 113 with an optical link 108b. For simplicity, FIG. 5 only shows four such optical links (two DQ, one CMD of a CLK path). The individual optical links 108b connect with transmitter/receivers 211 or receivers 213 on the memory modules which convert the optical signals to electrical signals for use by memory devices 112 and electrical signals to optical signals for data read from the memory devices 112.

As seen, there are several different techniques of optical data transmission which can be used on the optical link 108 in the present invention. These techniques can include but are not limited to Time Division Multiplexing (TDM). Using TDM, data from multiple pins can be used to occupy a single optical channel. Also, TDM can be used in conjunction with other optical data transmission schemes to reduce the number of optical channels (either fiber or wavelength) needed within an optical system. Two more examples of such techniques are Wavelength Division Multiplexing (WDM) and Frequency Division Multiplexing (FDM). Additionally, data compression techniques can be used. Such techniques have in common that they reduce the volume of data transmitted, the number of optical channels needed, or both.

An embodiment of the present invention using WDM is shown in FIG. 2. WDM enables the simultaneous transmission of multiple data channels on the same physical optical link, by utilizing several different wavelengths on that optical link at the same time. An optical multiplexer (mux) portion of the multiplexer/demultiplexer 207, 209 combines different wavelength bands from individual optical sources into a multiple wavelength light beam for simultaneous transmission through a common optical link. At the receiving end of the optical link, an optical demultiplexer (demux) portion of a multiplexer/demultiplexer 209 demultiplexes or spatially disburses collimated multiple wavelength light from the optical link into separate wavelength bands, each of which can be directed to an individual optical receiver. Although FIG. 2 shows combination of multiplexer/demultiplexer devices 207, 209 it should be apparent that separate multiplexers and demultiplexers can be used as well to perform the required multiplexing and demultiplexing functions. Another optical transmission technique, as shown in FIG. 5, uses a separate optical link for each data path.

It should also be noted that although all data paths (e.g., write/read data (DQ), command (CMD), address (ADD), clock (CLK) between the memory controller 104 and modules 113 are shown as utilizing optical transmission, it is also possible to use optical transmission only on the high speed data paths, e.g. the write/read data (CD) and clock (CLK) paths and utilize conventional electrical bus lines for slower speed data paths, e.g. command (CMB), address (ADD).

The present invention can use any modulation format in the optical link to optimize either Signal to Noise Ration (SNR) or bandwidth utilization. This could include conventional digital modulation techniques such as FM or Non Return To Zero (NRTZ).

Figure 6:
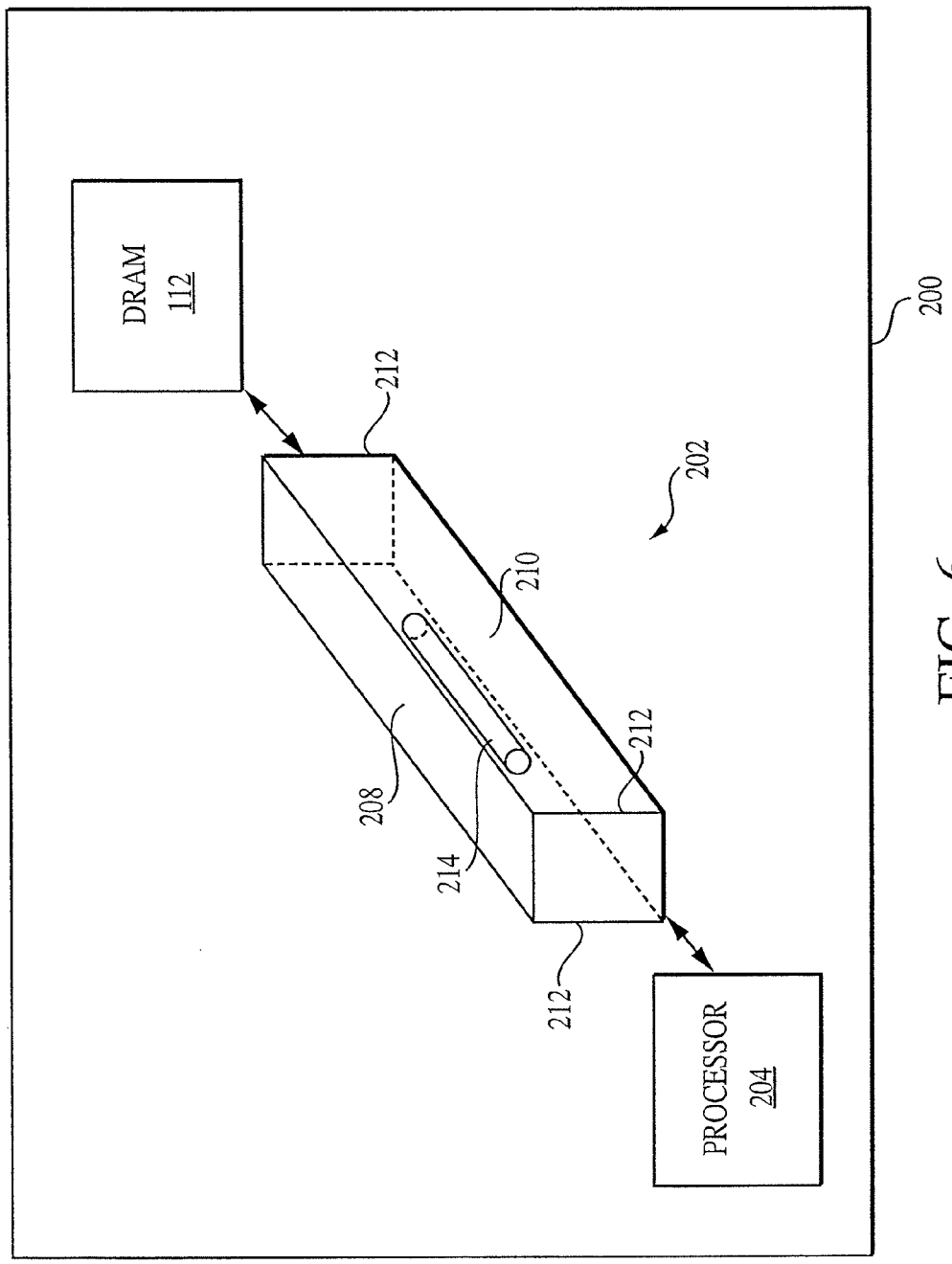
FIG. 6 shows a fourth exemplary embodiment of the invention.

The processor 100, controller 104, and memory devices 112 are typically located on separate dies with the memory devices being mounted on modules 113 which connect with the optical link 108a or 108b. However, it is also possible to integrate the processor and memory devices on the same die, with the processor incorporating the functions of the memory controller or with the memory controller also being integrated on the processor die. In the case where they are located on the same die, an integrated optical waveguide can be used to link them. FIG. 6, for example, shows an exemplary confined square pipe waveguide 212. Positioned on die 200, the waveguide 202 connects a processor with an integrated memory controller with DRAM 112. The waveguide 200 has a first metal layer 208 on top, a second metal layer 210 on the bottom, end plates 212 connecting the top and bottom layers, and an optically transmissive insulator 214 in middle through which light pulses carrying data are transmitted. The two metal layers (208, 210) act as waveguides confining the light pulses. The insulator 214 could be made of SiO2 which is commonly used in chip formation. Furthermore, in those configurations where the processor 204 and memory devices 206 are not on the same wafer or die and the module 113 and controller 104 are omitted, the waveguide 202 could also be implemented in freespace (air or vacuum).

Figure 7:
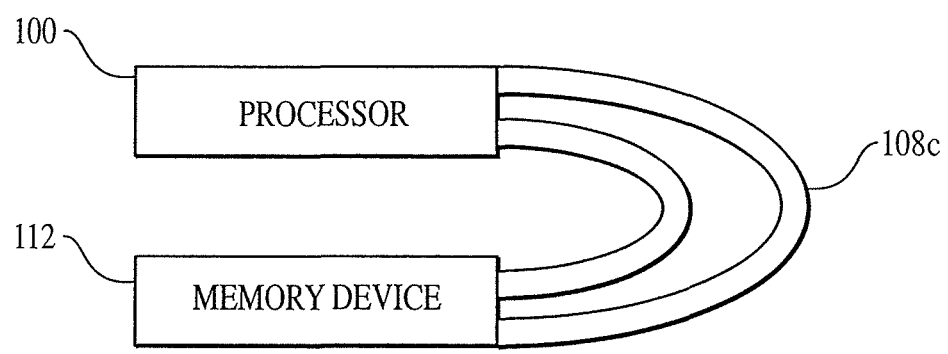
FIG. 7 shows a fifth embodiment of the invention.

FIG. 7 shows an optical link 108c in the form of a flexible optical fiber. Using such a fiber, a processor 100 and memory devices 112 can be integrated on separate dies residing in separate planes and packaged separately or together, with the processor 100 and memory devices 112 being interconnected by the flexible optical fiber 108c. This allows easier fabrication of the bus lines as well as non-planar stacking of processor 100 and DRAM devices 112 in separate or common packaging.

All of the above embodiments have in common that they achieve electrical isolation between the memory device 112 and the controller 104. They also make the optical link 108a, 108b, and 108c interconnections immune to noise, including at high frequency. Because the link is operated at high frequency, the clock signal for latching in data is sent with the data. Because fiber optic links do not affect pulse shape as do conventional electrical links, the memory devices 112 can be placed a greater distance from the controller 104 than is conventional. An additional advantage of the invention is that fiber optic links have lower power dissipation than conventional electrical links. This is because fiber optic links do not require I/O buffers, which consume power and also slow the propagation rate at which data is transferred.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

The invention claimed is:
1. A memory system comprising:
a memory device;
an access device for accessing the memory device;
an optical link between the access device and the memory device;
a plurality of bidirectional optical channels on the optical link for sending data between the access device and the memory device, each of the bidirectional optical channels having an associated communication wavelength;
a plurality of unidirectional optical channels on the optical link for sending commands and addresses from the access device to the memory device, each of the unidirectional channels having an associated communication wavelength;
a first plurality of electrical/optical transducers coupled to the access device for converting electrical data signals from the access device to optical signals on at least one of the plurality of bidirectional optical channels and for converting optical signals from at least one of the plu- rality of bidirectional optical channels to electrical data signals which are provided to the access device;

a second plurality of electrical/optical transducers coupled to the access device for converting electrical command and address signals from the access device to optical signals on at least one of the plurality of unidirectional optical channels; and a wave division optical multiplexer/demultiplexer coupled between the first and second pluralities of electrical/optical transducers and the optical link for multiplexing optical channels which are transmitted to the optical link and for demultiplexing optical channels received from the optical link, wherein the memory device, the access device, and the optical link are all integrated onto the same die.

2. The memory system of claim 1, wherein the electrical data signals are compressed before being converted.

3. The memory system of claim 1, wherein signals sent over the optical link are modulated using frequency modulation (FM) or non return to zero (NR TZ) modulation.

4. A memory system comprising:
a plurality of memory modules, each containing a plurality of memory devices;
an access device for sending data to and receiving data from the memory devices;
an optical link between the access device and plurality of memory modules;
a bidirectional electrical to optical converter for converting electrical signals generated by the access device to optical signals at predefined optical wavelengths for transmission to the optical link and for converting optical signals received from the optical link to electrical signals; and
an optical multiplexer/demultiplexer connected between the optical bidirectional electrical to optical converter and the optical link,
wherein the access device, the memory devices, bidirectional electrical to optical converter and multiplexer/demultiplexer are integrated together on the same integrated circuit chip.

5. The memory system of claim 4, wherein the electrical signals are compressed before being converted.

6. The memory system of claim 4, wherein signals sent over the optical link are modulated using frequency modulation (FM) or non return to zero (NRTZ) modulation.

7. The memory system of claim 4, wherein the optical multiplexer/demultiplexer uses Time Division Multiplexing (TDM).

8. The memory system of claim 4, wherein the optical multiplexer/demultiplexer uses Wave Division Multiplexing (WDM).

9. A memory system comprising:
a memory controller;
an optical link for transmitting data to and from the memory controller;
at least one memory storage device, each at least one memory storage device comprising a memory-side electro-optical converter coupled to the optical link;
a controller-side electro-optical converter for converting communications between the memory controller and the optical link;
a plurality of electrical channels for sending electrical signals between the memory controller and the controller-side electro-optical converter, wherein the optical link comprises a plurality of optical channels, each optical channel corresponding to one of the plurality of electrical channels and having a respective operating wavelength,
wherein the memory controller, the optical link, and the memory storage device are all integrated on the same die.

10. The memory system of claim 9, wherein the relationship between the plurality of optical channels and the plurality of electrical channels is one to one.

11. The memory system of claim 9, wherein at least one of the plurality of optical channels sends command data from the controller-side electro-optical converter.

12. The memory system of claim 9, wherein at least one of the plurality of optical channels sends a clock signal from the controller-side electro-optical converter.

13. The memory system of claim 9, wherein at least one of the plurality of optical channels sends read/write data between the controller-side electro-optical converter and the memory-side electro-optical converter.

14. The memory system of claim 9, wherein the electrical signals are compressed.

15. A memory system comprising:
a memory controller;
a memory storage device;
a transmitter for receiving electrical communications from the memory controller and for transmitting time division multiplexed optical signals via an optical link to the memory storage device, the memory storage device comprising a demultiplexer coupled to the optical link to receive and demultiplex the time division multiplexed optical signals; and
a receiver for converting the demultiplexed optical signals to electrical signals and for sending the electrical signals to the memory storage device,
wherein the memory controller, the memory storage device, the transmitter, and the receiver are all integrated on the same die.

16. The memory system of claim 15, wherein the electrical communications are compressed before being converted into optical signals.

17. A memory system comprising:
a memory controller;
a bi-directional optical link for transmitting data to and from the memory controller;
at least one memory storage device, each at least one memory storage device comprising a memory-side electro-optical converter coupled to the bi-directional optical link; and
a controller-side electro-optical converter for converting communications between the memory controller and the bi-directional optical link;
wherein said data includes read/write data which originates on a plurality of electrical paths, said bi-directional optical link comprising at least one optical waveguide associated with said plurality of electrical paths, and
wherein said memory controller, at least one memory storage device, and the bi-directional optical link are all integrated on the same die.

18. The memory system of claim 17, wherein data on the plurality of electrical paths is compressed and before being converted for transmission on the bi-directional optical link.

19. The memory system of claim 17, further comprising a processor that incorporates the memory controller, wherein the processor, memory storage device, and plurality of optical waveguides are all integrated on the same die.

* * * * *